US011051421B1

(12) United States Patent
Chen et al.

(10) Patent No.: US 11,051,421 B1
(45) Date of Patent: Jun. 29, 2021

(54) MEMORY COOLING SYSTEM IN A SERVER

(71) Applicant: Quanta Computer Inc., Taoyuan (TW)

(72) Inventors: Yi-Chieh Chen, Taoyuan (TW);
Yueh-Chang Wu, Taoyuan (TW);
Ching-Yi Shih, Taoyuan (TW)

(73) Assignee: QUANTA COMPUTER INC.,
Taoyuan (TW)

( * ) Notice: Subject to any disclaimer, the term of this patent is extended or adjusted under 35 U.S.C. 154(b) by 0 days.

(21) Appl. No.: 16/818,019

(22) Filed: Mar. 13, 2020

(51) Int. Cl.
G06F 1/16 (2006.01)
H05K 5/00 (2006.01)
H05K 7/00 (2006.01)
H05K 7/14 (2006.01)
H05K 7/20 (2006.01)

(52) U.S. Cl.
CPC ....... *H05K 7/1485* (2013.01); *H05K 7/20763* (2013.01)

(58) Field of Classification Search
CPC ............ H05K 7/1485; H05K 7/20763; H05K 7/20772; H05K 7/20781; H05K 7/208; H05K 7/20809; H05K 7/20818; H05K 7/20836
USPC ................................................ 361/725–727
See application file for complete search history.

(56) References Cited

U.S. PATENT DOCUMENTS

| 10,561,040 | B1* | 2/2020 | Lunsman | H05K 7/20272 |
| 2010/0252234 | A1* | 10/2010 | Cambell | H05K 7/20781 165/80.2 |
| 2011/0075367 | A1* | 3/2011 | Campbell | H05K 7/20781 361/699 |
| 2014/0049908 | A1* | 2/2014 | Eriksen | G06F 1/187 361/679.53 |
| 2014/0224456 | A1* | 8/2014 | Takasu | H05K 7/20218 165/104.33 |
| 2016/0178475 | A1* | 6/2016 | Krishnan | H05K 7/20772 324/713 |
| 2019/0350107 | A1* | 11/2019 | Cader | H05K 7/20254 |
| 2020/0367387 | A1* | 11/2020 | Selvidge | H05K 7/20509 |
| 2021/0092878 | A1* | 3/2021 | Gao | H05K 7/20772 |

* cited by examiner

*Primary Examiner* — Anthony M Haughton
(74) *Attorney, Agent, or Firm* — Nixon Peabody LLP

(57) ABSTRACT

A cooling assembly includes a primary plate, a secondary plate, and a padding layer. The primary plate includes a body, a first arm, and a second arm. The first arm and the second arm of the primary plate extend outwardly in opposite directions from the body of the primary plate. The secondary plate also includes a body, a first arm, and a second arm. The first arm and the second arm of the secondary plate extend outwardly in opposite directions from the body of the secondary plate. The padding layer is inserted between the primary plate and the secondary plate. The padding layer directly contacts a heat-generating electrical component secured between the primary plate and the secondary plate.

19 Claims, 11 Drawing Sheets

MEMORY COOLING SYSTEM IN A SERVER

TECHNICAL FIELD

This disclosure relates generally to cooling systems, and more particularly, to liquid cooling systems for memories in computer devices such as servers.

BACKGROUND

Computer devices, such as servers, include numerous electronic components that are powered by a common power supply. Servers generate an enormous amount of heat due to the operation of internal heat-generating electrical devices such as controllers, processors, and memory. Overheating from the inefficient removal of such heat has the potential to shut down or impede the operation of such devices. Thus, current servers are designed to rely on the air flowing through the interior of the server to carry away heat generated from heat-generating electrical components.

For example, Double Data Rate 4 (DDR4) Synchronous Dynamic Random-Access Memory (SDRAM) is a fourth generation SDRAM that is used in modern servers. The power consumption of DDR4 is around 4 to 18 Watts. With the high performance demand of a modern server system having multiple memories, its total power consumption can increase exponentially. The maximum clock rate (e.g., transfer rate) of a DDR4 can be as high as 3,200 MT/s.

Traditional air cooling systems are based on cooling fans. The cooling fans reduce ambient temperature surrounding the memory by circulating air to transfer heat emitted by the memory. Due to the improvement of high-performance systems, the amount of heat that needs to be removed becomes higher with each new generation of memory. Therefore, a traditional air cooling system is often unable to sufficiently cool down a server system having such high power demand from its DDR4 memories. A traditional air cooling system has a thermal limitation around 15 to 18 Watts, which is barely sufficient to cool DDR4 memories.

Moreover, in a server system, there are many other heat-generating electrical components and/or devices (e.g., HDD, CPU, PCIe card, etc.) that also need to be cooled. As such, a traditional air cooling system may be insufficient to cool both the CPU and the memories, let alone the upstream preheating of HDD and/or PCIe cards.

Further, in a next generation SDRAM, such as Double Data Rate 5 (DDR5), the maximum clock rate can increase to 6,400 MT/s, or even 8,400 MT/s. The power consumption may increase to 20 to 28 Watts or higher. Thus, traditional air cooling systems will not be sufficient for operating the next generation memory devices.

In current air cooling systems, heat sinks are used to absorb the heat from the memory, and thereby transferring heat away from the memory. The heat from the heat sinks are vented away from the server by the cooling fans. However, traditional air cooling, with or without heat sinks, is inadequate to sufficiently remove heat generated by newer generation components. Therefore, development of liquid cooling has been spurred by the need for increased cooling.

In rack level liquid cooling system designs, a cooling liquid source includes a closed loop cooling system and an open loop cooling system to facilitate heat exchange from devices such as servers in the rack. Closed loop liquid cooling systems circulate coolant, such as water, through a loop of pipes through the servers in a rack. Heat from the servers is carried away by the coolant. The closed loop system uses heat exchange to cool hot water which is heated from the servers. Heat is then removed from the hot water via an open loop system such as a fan wall.

An inlet tube carries coolant liquid to a cold plate. Cold plates are installed in contact with a heat-generating electrical component, such as a processor chip, in the server. The cold plate has a network of internal conduits that circulate the coolant internally in the cold plate. Each processor in a server may have a dedicated cold plate or share a cold plate with another processor. Heat generated by the processor is transferred to the cold plate and is in turn transferred to the coolant liquid circulating through the cold plate. An outlet tube carries heated liquid away from the cold plate. In a server, DIMM slots for memory devices are typically laid out next to the processor.

In addition, the inlet tube can also carry coolant liquid through a manifold in thermal contact with plates located in a gap between two adjacent memory cards. The plates are covered by a thick pad, which directly contacts the memory card, once the memory card is assembled into its DIMM slot. Heat generated by the memory card is transferred to the plate, via the thick pad. The heat is, in turn, transferred to the coolant liquid flowing inside the manifold. The outlet tube carries heated liquid away from the manifold, and the tubes from the cold plates. A heat exchanger transfers heat from the heated liquid by being cooled by a fan wall. The now cooled coolant is then recirculated to the inlet tube back to the cold plate and the manifold.

Liquid cooling can provide rapid heat removal due to the superior thermal performance from liquid cooling. At room temperature, the heat transfer coefficient of air is only 0.024 W/mK. On the other hand, a coolant, such as water, has a heat transfer coefficient of 0.58 W/mK, which is 24 times than that of air. Thus, liquid cooling is more effective in transporting heat away from a heat source to a radiator, and allows heat removal from critical parts without noise pollution.

FIG. 1 is a top view of a prior art server 10 having memory cooling modules. The server 10 includes a chassis 12 that has a circuit board for mounting components, such as memory cards and processors. In this example, two cold plates 22 and 24 are mounted over heat-generating electrical components, such as processors, to transfer heat away from the processors. Two memory cooling modules 30 and 32 are mounted on opposite sides of the cold plates 22 and 24. A series of metal tubes are provided to circulate coolant to the cold plates 22 and 24, and to the memory cooling modules 30 and 32. Generally, the chassis 12 includes fluid connectors that may be fluidly connected to a rack mounted heat exchanger.

The server 10 also includes two plastic tubes 40 and 42 that carry coolant from the fluid connectors. The plastic tube 40 is an inlet tube that provides coolant to the cold plates 22 and 24, and to the memory cooling modules 30 and 32. The plastic tube 40 is a plastic hose that is coupled to the cold plate 22, via a manifold 30a of the memory cooling module 30, and via a first metal tube 50. The plastic tube 40 directs the coolant through the manifold 30a of the memory cooling module 30. The coolant then travels to the cold plate 22, via the first metal tube 50. The cold plate 22 is coupled to the cold plate 24, via a second metal tube 52. The coolant is thus provided by the second metal tube 52 to the second cold plate 24.

The coolant is circulated internally in both cold plates 22 and 24, to carry away heat generated from the processors, which are under the cold plates 22 and 24. The coolant then travels from the cold plate 24 to the cold plate 22, via a third metal tube 54. The third metal tube 54 then directs the coolant to a manifold 32a of the memory cooling module 32. The heated coolant received by the manifold 32a of the memory cooling module 32, is then carried away by the plastic tube 42, to the rack mounted heat exchanger.

Heat-generating memory cards can be placed between metal plates 34a-34c of the memory cooling module 30, and/or between metal plates 36a-36c of the memory cooling module 32. The metal plates 34a-34c are each attached to the manifold 30a. The manifold 30a is thus in thermal contact with the metal plates 34a-34c. Similarly, the metal plates 36a-36c are each attached to the manifold 32a. The manifold 32a is thus in thermal contact with the metal plates 36a-36c. The manifolds 30a and 32a include internal conduits that circulate coolant internally, which transfer heat away from the memory cards via the metal plates 34a-34c of the memory cooling module 30, and metal plates 36a-36c of the memory cooling module 32. As such, the memory cooling modules 30 and 32 can transfer heat away from the memory cards.

The metal plates 34a-34c are joined by a lateral plate 30b of the memory cooling module 30, opposite the manifold 30a. The metal plates 36a-36c are joined by a lateral plate 32b of the memory cooling module 32, opposite the manifold 32a. The lateral plate 30b of the memory cooling module 30 is coupled to the lateral plate 32b of the memory cooling module 32, via a fourth metal tube 56. Coolant from the manifold 30a is also circulated to the lateral plate 30b, via additional tubes under the metal plates 34a-34c. Alternatively, the metal plates 34a-34c themselves are flatted tubes carrying coolant. The coolant is circulated from the lateral plate 30b of the memory cooling module 30, to the lateral plate 32b of the memory cooling module 32. The coolant then travels from the lateral plate 32b of the memory cooling module 32, to the manifold 32a of the memory cooling module 32, via additional tubes under the metal plates 36a-36c.

In order to provide sufficient contact for heat transfer between the metal plates and the memory cards, memory cooling modules 30 and 32 include thick pads. For example, the metal plate 34a includes a thick pad 64a. The metal plate 34b includes a thick pad 64b. A memory card can be placed between the metal plate 34a and the metal plate 34b, while directly contacting the thick pad 64a and the thick pad 64b.

However, thick pads (such as the thick pads 64a and 64b) often have durability issues. Depending on what pad is used, there may also be issues with maintaining contact with the memory to provide maximum thermal conductivity. For example, an elastic pad may have fatigue issues. As another example, after time, friction caused by removal and reattachment of the memory cards can often damage the thick pads and/or the memory cards. Even if the memory cards are being replaced, the damaged thick pads can also cause friction, which in turn damages the new memory cards. Further, if a small portion of the memory cooling module 30 needs repair or replacement, the entire memory cooling module 30 must be removed from the chassis 12. The operation of the cooling system must also be suspended because the memory cooling module 30 is a part of the continuous circulation of coolant.

Thus, a need exists for a cooling system that provides adequate heat distribution, and allows for the flexibility of replacing individual components of the cooling system.

SUMMARY

According to some implementations of the present disclosure, a cooling assembly includes a primary plate, a secondary plate, and a first padding layer. The primary plate includes a body, a first arm, and a second arm. The first arm and the second arm of the primary plate extend outwardly in opposite directions from the body of the primary plate. The secondary plate also includes a body, a first arm, and a second arm. The first arm and the second arm of the secondary plate extend outwardly in opposite directions from the body of the secondary plate. The first padding layer is between the primary plate and the secondary plate. The first padding layer directly contacts a heat-generating electrical component. The heat-generating electrical component is to be secured between the primary plate and the secondary plate.

In some examples, the primary plate further includes a protrusion. The protrusion extends perpendicularly from the primary plate. The protrusion is configured to engage a corresponding aperture of the secondary plate, to secure the heat-generating electrical component between the primary plate and the secondary plate.

In some examples, the protrusion of the primary plate extends through a notch of the heat-generating electrical component, to secure the heat-generating electrical component between the primary plate and the secondary plate.

In some examples, the heat-generating electrical component is a memory card. In some examples, the memory card is a Synchronous Dynamic Random-Access Memory (SDRAM). In some examples, the SDRAM is a Double Data Rate 5 (DDR5) SDRAM.

In some examples, the cooling assembly further includes a heat pipe in contact with a depression of the primary plate. The depression corresponds to a shape of the heat pipe. In some examples, the heat pipe is configured to snap-fit to the depression of the primary plate. In some examples, the heat pipe is U-shaped, and extends across a width of the body of the primary plate.

In some examples, the cooling assembly further includes a second padding layer, which is between the primary plate and the secondary plate. The first padding layer and the second padding layer directly contact opposite sides of the heat-generating electrical component.

According to some implementations of the present disclosure, a coolant circulation system includes an inlet, an outlet, a fluidic circuit between the inlet and the outlet, a first cooling shelf, and a second cooling shelf. The inlet delivers coolant at a first temperature. The outlet delivers coolant at a second temperature, where the second temperature is greater than the first temperature. The fluidic circuit includes a first tube and a second tube. The first tube is coupled to the inlet. The second tube is coupled to the first tube and the outlet. The first cooling shelf is in conductive thermal contact with the first tube. The second cooling shelf is in conductive thermal contact with the second tube. The first cooling shelf and the second cooling shelf support a first cooling assembly, which includes a contact plate, a first arm portion, and a second arm portion. The first arm portion of the first cooling assembly is in conductive thermal contact with the first cooling shelf. The second arm portion of the first cooling assembly is in conductive thermal contact with the second cooling shelf.

In some examples, the contact plate of the first cooling assembly is configured to house a heat-generating electrical component, such that the first cooling assembly is in conductive thermal contact with the heat-generating electrical component. In some examples, the heat-generating electrical component is a memory card.

In some examples, the first arm portion of the first cooling assembly extends from a first end of the contact plate of the first cooling assembly. The second arm portion of the first cooling assembly extends from a second end of the contact plate of the first cooling assembly.

In some examples, the first tube is integral to the second tube.

In some examples, the space between the first cooling shelf and the second cooling shelf is configured to receive a second cooling assembly, such that an air flow path exists between the first cooling assembly and the second cooling assembly. In some examples, the space between the first cooling shelf and the second cooling shelf is configured to receive the first cooling assembly and the second cooling assembly in parallel.

In some examples, the first cooling assembly includes a primary plate and a secondary plate. The primary plate includes a body, a first arm, and a second arm. The secondary plate also includes a body, a first arm, and a second arm. The contact plate of the first cooling assembly includes the body of the primary plate, and the body of the secondary plate. The first arm portion of the first cooling assembly includes the first arm of the primary plate, and the first arm of the secondary plate. The second arm portion of the first cooling assembly includes the second arm of the primary plate, and the second arm of the secondary plate.

In some examples, the coolant circulation system further includes a cooling fan positioned at an end of the coolant circulation system.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

Figure 1:
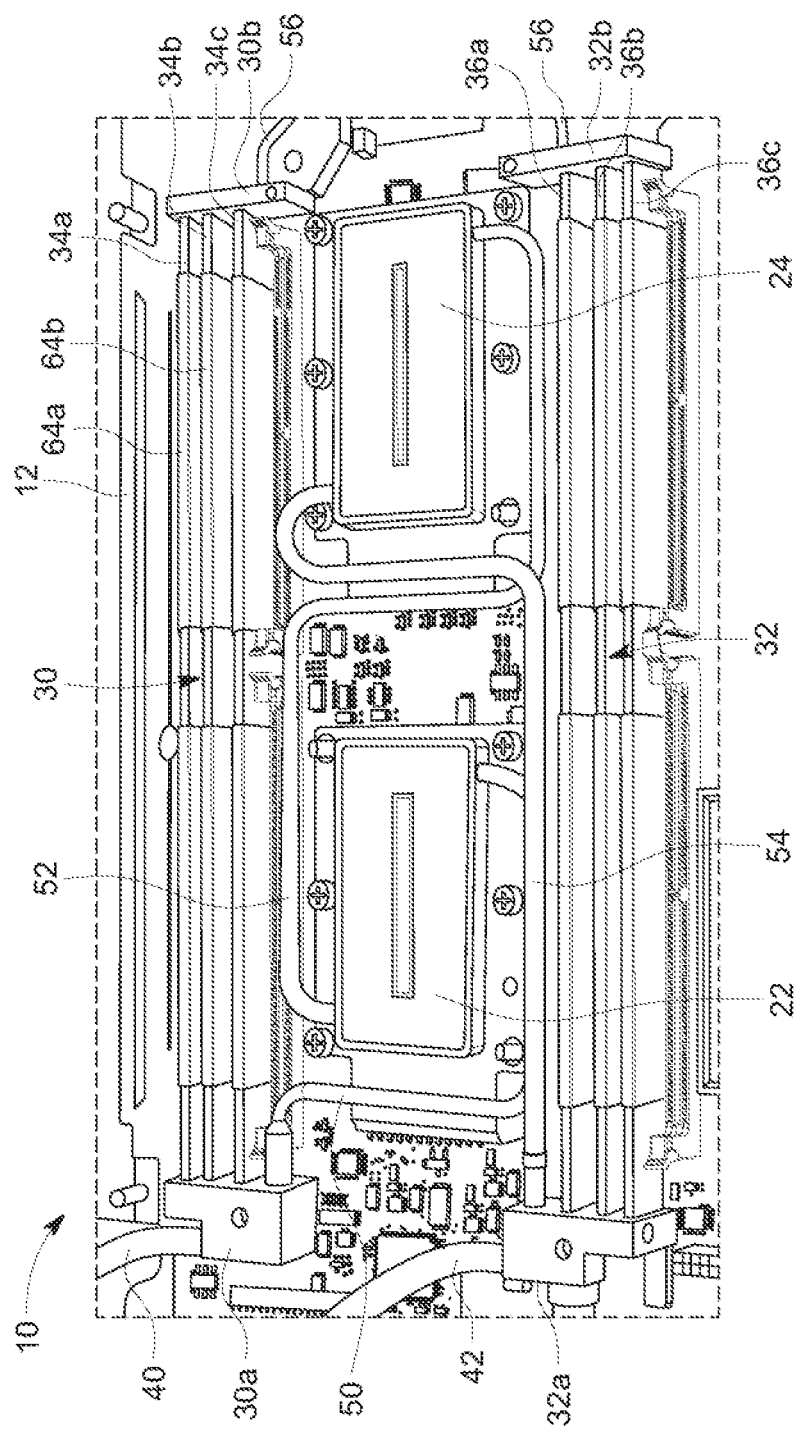
FIG. 1 depicts a top view of a server having prior art memory cooling modules, according to some implementations of the present disclosure.

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

DETAILED DESCRIPTION

The present inventions can be embodied in many different forms. Representative embodiments are shown in the drawings, and will herein be described in detail. These embodiments are examples or illustrations of the principles of the disclosure but are not intended to limit its broad aspects. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure relates to a memory cooling assembly for coupling to a coolant circulation system. The memory cooling assembly has a body portion to be received by a space between two cooling shelves of the coolant circulation system. The memory cooling assembly can receive a memory card inside the body portion of the memory cooling assembly. Each of the two cooling shelves is in conductive thermal contact with a metal tube carrying coolant, and also with a respective arm portion of the memory cooling assembly. Heat generated by the memory card is transferred to the body portion of the memory cooling assembly, then to the arm portions of the memory cooling assembly, and then to the cooling shelves. The heat then is transferred to the metal tubes, and is eventually carried away by the circulating coolant.

Figure 2:
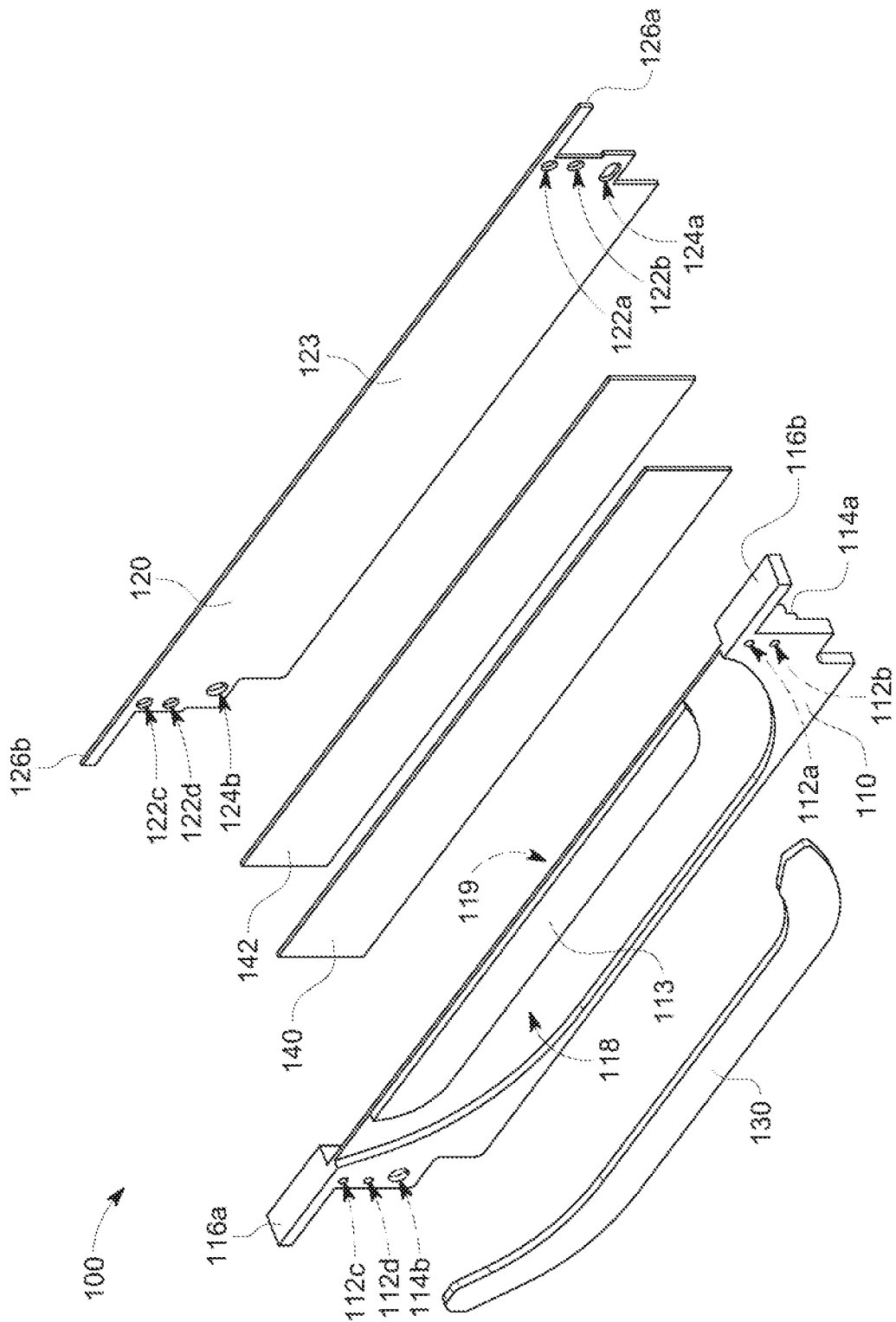
FIG. 2 depicts an exploded axonometric view of an example cooling assembly, according to some implementations of the present disclosure.

Referring to FIG. 2, an exploded axonometric view of an example cooling assembly is depicted, according to some implementations of the present disclosure. As shown, a cooling assembly 100 includes a primary plate 110, a secondary plate 120, a heat pipe 130, a first padding layer 140, and a second padding layer 142. The primary plate 110 has two opposite surfaces: a first surface facing the secondary plate 120, and an opposite, second surface that holds the heat pipe 130. The first surface includes a depression 119 that can fit the shape of a memory card (e.g., the memory card 150 of FIG. 3). The second surface includes a depression 118 that fits the shape of the heat pipe 130.

The primary plate 110 includes a body 113, a first arm 116a, and a second arm 116b. The first arm 116a and the second arm 116*b* extend outwardly in opposite directions from the body 113. The primary plate 110 can be of any suitable heat conductive material, such as aluminum and/or copper. The secondary plate 120 is generally thinner than the primary plate 110, and mimics the overall outline of the primary plate 110. The secondary plate 120 also includes a body 123, a first arm 126*a*, and a second arm 126*b*. The first arm 126*a* and the second arm 126*b* extend outwardly in opposite directions from the body 123. The secondary plate 120 can be of any suitable heat conductive material, such as aluminum. In some implementations, the primary plate 110 transfers heat from the memory card (e.g., provides primary thermal conductivity), while the secondary plate 120 provides structural stiffness.

Figure 4:
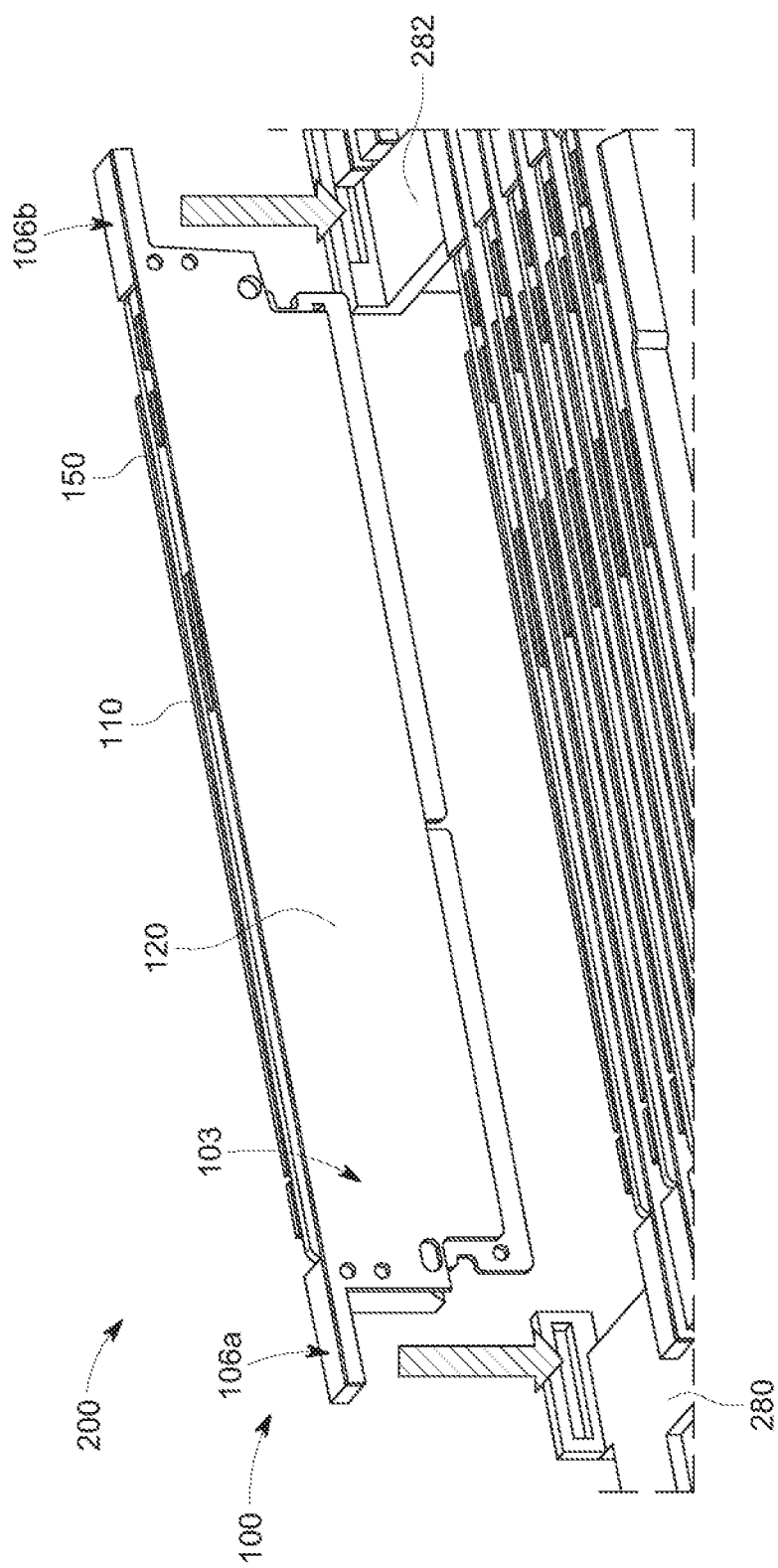
FIG. 4 depicts a front axonometric view of the example cooling assembly being installed in a coolant circulation system, according to some implementations of the present disclosure.

The primary plate further includes six protrusions 112*a*, 112*b*, 112*c*, 112*d*, 114*a*, and 114*b* (best shown in FIG. 4). Each protrusion extends perpendicularly from the primary plate 110, from the first surface facing the secondary plate 120. Each protrusion is configured to engage a corresponding aperture of the secondary plate 120. For example, the protrusion 112*a* is configured to engage the aperture 122*a* on the secondary plate 120. The protrusion 112*b* is configured to engage the aperture 122*b*. The protrusion 112*c* is configured to engage the aperture 122*c*. The protrusion 112*d* is configured to engage the aperture 122*d*. The protrusion 114*a* is configured to engage the aperture 124*a*. The protrusion 114*b* is configured to engage the aperture 124*b*.

In some implementations, one or more of the protrusions 112*a*, 112*b*, 112*c*, 112*d*, 114*a*, and 114*b* of the primary plate 110 are openings and/or cavities for receiving a screw to couple to the secondary plate 120. For example, in some such implementations, the protrusions 112*a*, 112*b*, 112*c*, and 112*d* are cavities, and each cavity is configured to receive a screw through its corresponding aperture (122*a*, 122*b*, 122*c*, or 122*d*).

While the cooling assembly 100 is shown as including six pairs of protrusions and apertures (112*a* and 122*a*; 112*b* and 122*b*; 112*c* and 122*c*; 112*d* and 122*d*; 114*a* and 124*a*; and 114*b* and 124*b*) described herein with respect to FIGS. 2 and 4, more or fewer pairs of protrusions and apertures can be included in a cooling assembly (e.g., one pair, two pairs, three pairs, four pairs, five pairs, seven pairs, ten pairs, etc.).

Still referring to FIG. 2, the heat pipe 130 is joined to the primary plate 110 on the opposite surface (i.e., the second surface) from the four protrusions 112*a*, 112*b*, 112*c*, and 112*d*. The primary plate 110 includes the depression 118 corresponding to a shape of the heat pipe 130, such that the heat pipe 130 can be embedded into the depression 118 of the primary plate 110. For example, in some implementations, the heat pipe 130 can snap-fit to the depression 118 of the primary plate 110. As depicted in FIG. 2, the heat pipe 130 is generally U-shaped, and extends across a width of the body 113 of the primary plate 110. Therefore, the depression 118 of the primary plate 110 is also generally U-shaped, matching the shape of the heat pipe 130.

In some implementations, the heat pipe 130 can have its own coolant, such as water or dielectric fluid. For example, the heat pipe 130 can include a hollow tube with a wick structure inside. The heat pipe 130 can include a two-phase heat transfer process (e.g., liquid to air, and air to liquid). The two-phase heat transfer process can provide good thermal conductivity, while maintaining a higher pressure inside the heat pipe 130 compared to the ambient pressure. In some implementations, conductivity of the heat pipe 130 is about 6,000 to about 10,000 W/mK, whereas that of copper is about 385 W/mK, and that of aluminum is about 230 W/mk.

In some implementations, the heat pipe 130 can be of any suitable heat conductive material that is similar to or the same as the primary plate 110 and/or the secondary plate 120. In some implementations, the heat pipe 130 provides structural support to the primary plate 110, regardless of its heat conductivity. In some implementations, the heat pipe 130 is of a different material from the primary plate 110, and provides higher heat conductivity than the primary plate 110.

Figure 3:
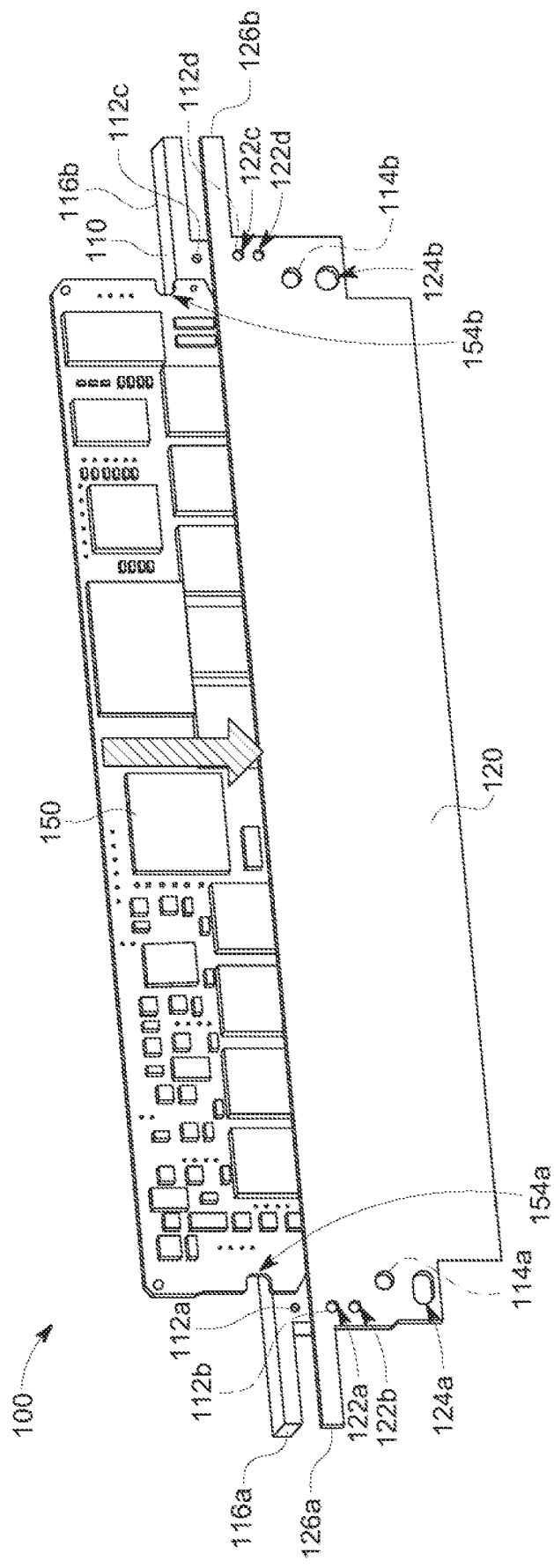
FIG. 3 depicts a partially exploded axonometric view of the example cooling assembly in FIG. 2 receiving a memory card, according to some implementations of the present disclosure.

The padding layers 140 and 142 are inserted between the primary plate 110 and the secondary plate 120. The padding layers 140 and 142 directly contact a heat-generating electrical component (e.g., a memory card 150 as shown in FIGS. 3-4). For example, the first padding layer 140 can be placed in contact with a first side of the heat-generating electrical component, while the second padding layer 142 can be placed on an opposite side of the heat-generating electrical component.

While the cooling assembly 100 is shown as including all of the components described herein with respect to FIG. 2, more or fewer components can be included in a cooling assembly for receiving a heat-generating electrical component, and redistributing heat from the heat-generating electrical component. For example, a first alternative cooling assembly includes the primary plate 110, the secondary plate 120, the first padding layer 140, and the second padding layer 142. For example, a second alternative cooling assembly includes the primary plate 110, the secondary plate 120, the heat pipe 130, and the first padding layer 140. For example, a third alternative cooling assembly includes the primary plate 110 and the secondary plate 120. Thus, various cooling assemblies for receiving a heat-generating electrical component and redistributing heat from the heat-generating electrical component, can be formed using any portion or portions of the components shown and described herein and/or in combination with one or more other components.

Referring to FIG. 3, a partially exploded axonometric view of the cooling assembly 100 and a heat generating electrical component such as an SDRAM memory card 150 is depicted. The cooling assembly 100 of FIG. 3 is similar to, or the same as, the cooling assembly 100 of FIG. 2, where identical reference numbers refer to identical components.

The memory card 150 includes two notches 154*a* and 154*b* formed at opposite sides of the memory card 150. The protrusion 114*a* of the primary plate 110 is configured to extend through the notch 154*a* of the memory card 150, towards the aperture 124*a* of the secondary plate 120. Similarly, the protrusion 114*b* of the primary plate 110 is configured to extend through the notch 154*b* of the memory card 150, towards the aperture 124*b* of the secondary plate 120. As such, the memory card 150 can be inserted (as shown in FIG. 4) between the primary plate 110 and the secondary plate 120. The combination cooling assembly 100 and memory card 150 may then be inserted in a DIMM slot on the circuit board of a server, such as the server 10 in FIG. 1.

As such, in some implementations, positioning of the protrusions 114*a* and 114*b* of the primary plate 110 can be dependent upon the positioning of the two notches 154*a* and 154*b* of the memory card 150. In turn, positioning of the apertures 124*a* and 124*b* of the secondary plate 120 is also dependent upon the positioning of the two notches 154*a* and 154*b* of the memory card 150.

Referring to FIG. 4, a front axonometric view of the cooling assembly 100 and inserted memory card 150 being installed in a coolant circulation system 200 is depicted. The cooling assembly 100 of FIG. 4 is similar to, or the same as, the cooling assembly 100 of FIGS. 2-3, where identical reference numbers refer to identical components. Details of the coolant circulation system 200 is described herein with reference to FIG. 6.

As shown in FIG. 4, the cooling assembly 100 is assembled to have the memory card 150 secured between the primary plate 110 and the secondary plate 120, as described with reference to FIG. 3. Once assembled, the bodies of the primary plate 110 and the secondary plate 120 form a body portion 103 of the cooling assembly 100. The two pairs of arms (116a, 116b, 126a, 126b) of the primary plate 110 and the secondary plate 120 form a pair of arm portions 106a and 106b. The body portion 103 can be received by a space between two cooling shelves 280 and 282 of the coolant circulation system 200.

Each of the two cooling shelves 280 and 282 of the coolant circulation system 200 is in conductive thermal contact with a respective arm portion 106a and 106b of the cooling assembly 100. For example, the cooling shelf 280 is in conductive thermal contact with the arm portion 106a. The cooling shelf 282 is in conductive thermal contact with the arm portion 106b. Heat generated by the memory card 150 is transferred to the primary plate 110 and the secondary plate 120 through the padding layers 140 and 142 of the body portion 103 of the cooling assembly 100; then to the arm portions 106a and 106b of the cooling assembly 100; and then to the cooling shelves 280 and 282.

Figure 5:
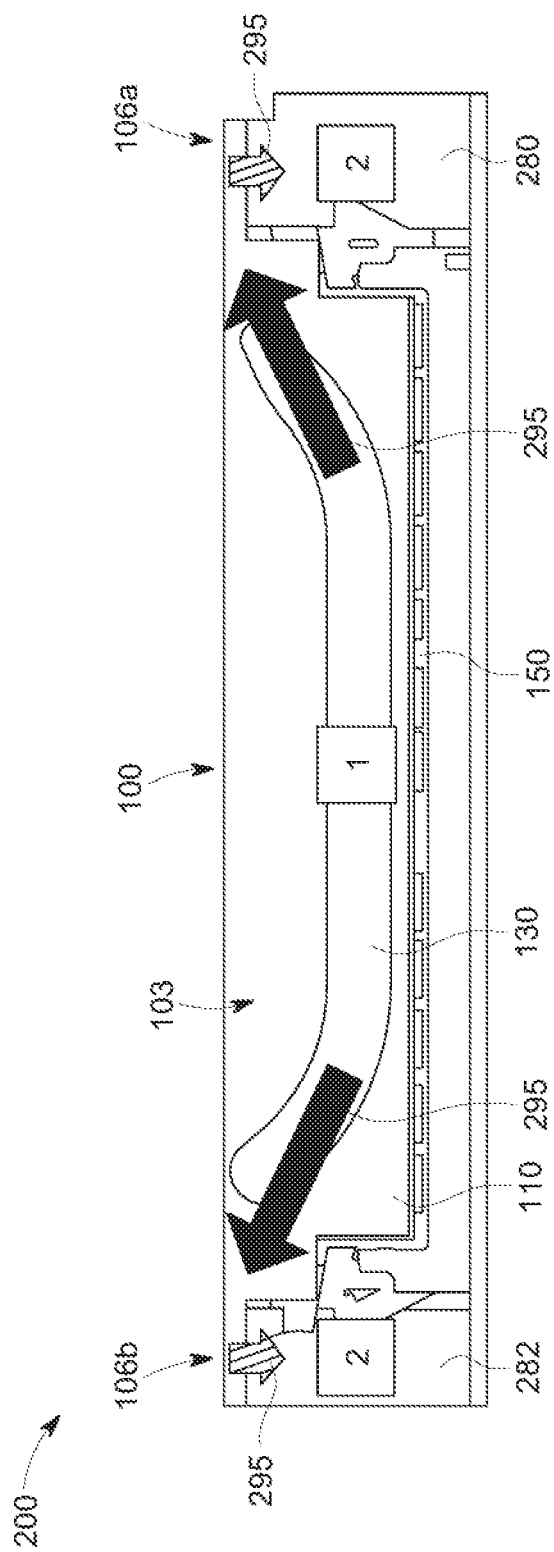
FIG. 5 depicts a rear cross-section view of the example cooling assembly, according to some implementations of the present disclosure.

The heat transfer process from the memory card 150 to the cooling shelves 280 and 282 is further illustrated in FIG. 5, where a rear cross-section view of the cooling assembly 100 is depicted. The cooling assembly 100 of FIG. 5 is the same as, or similar to, the cooling assembly 100 of FIG. 4, where identical reference numbers refer to identical components. Arrows 295 show the heat being transferred by the heat pipe 130, toward the arm portions 106a and 106b, and to the cooling shelves 280 and 282. Each of the two cooling shelves 280 and 282 is in conductive thermal contact with a metal tube carrying coolant, which is described in more detail herein with respect to FIG. 6. The heat is then transferred from the cooling shelves 280 and 282 to the metal tubes, and is eventually carried away by the circulating coolant.

Figure 6:
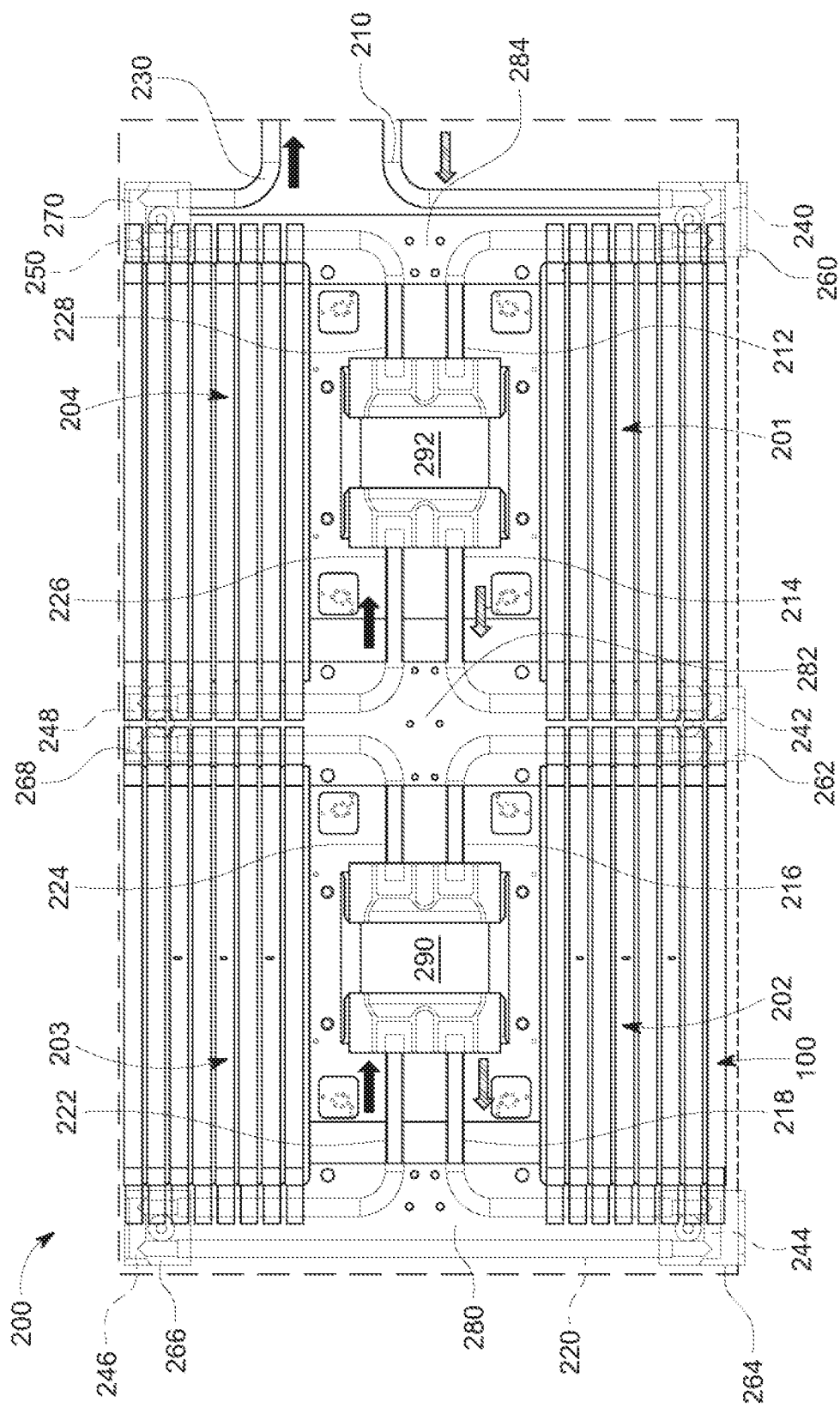
FIG. 6 depicts a top view of a coolant circulation system having example cooling assemblies, according to some implementations of the present disclosure.

Referring now to FIG. 6, a top view of the coolant circulation system 200 is depicted, according to some implementations of the present disclosure. The coolant circulation system 200 includes an inlet 210, an outlet 230, three cooling shelves (280, 282, and 284), two cold plates (290 and 292), nine metal tubes (212, 214, 216, 218, 220, 222, 224, 226, and 228), and six couplers (240, 242, 244, 246, 248, and 250). The two cold plates, the nine metal tubes, and the six couplers together form a fluidic circuit between the inlet 210 and the outlet 230. The inlet 210 delivers coolant at a first temperature into the fluidic circuit. The outlet delivers coolant at a second temperature out of the fluidic circuit, where the second temperature is greater than the first temperature.

The coolant circulation system 200 as shown in FIG. 6 includes four quadrants 201, 202, 203, and 204. Each quadrant is depicted as having eight cooling assemblies 100. Each cooling assembly 100 has a memory card (such as the memory card 150) inside, in a similar fashion as described with respect to FIGS. 3-4. Thus, the cooling assemblies in the first quadrant 201 is in conductive thermal contact with the two cooling shelves 282 and 284.

In some implementations, the inlet 210 directs coolant, such as cold water and/or dielectric fluid, through the coupler 240 to an internal conduit in shelf 284. The internal conduit in shelf 284 carries heat away from the cooling assemblies 100 in the quadrant 201 and directs the coolant to the metal tube 212. Additionally or alternatively, the inlet 210 directs coolant to the metal tube 212 via the coupler 240; and the shelf 284 is in direct contact with the metal tube 212 underneath, thus providing direct thermal transfer.

The coolant flows from the metal tube 212 to the metal tube 214, after circulating inside the cold plate 292. The cold plate 292, for example, can be mounted on top of another heat-generating electrical device, such as a processor. The coolant is then directed to an internal conduit in the shelf 282, where the coolant carries heat away from the opposite sides of the cooling assemblies 100 in the quadrant 201. The coupler 242 then directs the coolant to another internal conduit in the shelf 282, where it carries heat away from one side of the cooling assemblies 100 in the quadrant 202. Additionally or alternatively, the coupler 242 directs coolant from the metal tube 214 to the metal tube 216; and the shelf 282 is in direct contact with the metal tube 214 and the metal tube 216 underneath, thus providing direct thermal transfer.

The coolant then flows from the metal tube 216 to the metal tube 218, after circulating inside the cold plate 290. The cold plate 290, for example, can be mounted on top of another heat-generating electrical device, such as a second processor. The coolant is then directed from the metal tube 218 to the metal tube 220, via the coupler 244. In some implementations, the cooling shelf 280 is in direct contact with the metal tube 218 and the metal tube 220 underneath.

The coolant flows from the metal tube 220 to the metal tube 222, via the coupler 246. The coolant then flows from the metal tube 222 to the metal tube 224, after circulating inside the cold plate 290 (again). The metal tube 224 carries the coolant to the metal tube 226, via the coupler 248. The coolant then flows from the metal tube 226 to the metal tube 228, after circulating inside the cold plate 292 (again). The metal tube 228 carries the coolant to the outlet 230, via the coupler 250.

Referring specifically to the first quadrant 201, the coolant in the metal tube 212 flows underneath a portion of the cooling shelf 284, while the cooling shelf 284 is in conductive thermal contact with the metal tube 212. Similarly, the coolant in the metal tube 214 flows underneath a portion of the cooling shelf 282, while the cooling shelf 282 is in conductive thermal contact with the metal tube 212. Thus, as described herein with respect to FIGS. 4-5, heat generated by the memory cards in the first quadrant can transfer to the cooling shelves 280 and 282, which in turn, transfers to the metal tubes 212 and 214, and eventually carried away by the circulating coolant.

Similar heat transfer processes can occur in the second quadrant 202, the third quadrant 203, and the fourth quadrant 204. The metal tube 228 directs the heated coolant, through the coupler 250, and out to the outlet 230. The outlet 230 can then discharge the heated coolant. Alternatively, the outlet 230 is coupled to a heat exchanger, where the cooled coolant can be recirculated back into the coolant circulation system 200 via the inlet 210.

In some implementations, the coolant circulation system 200 further includes a metal cap for each of the six couplers. For example, the metal cap 260 covers the coupler 240, while the metal cap 270 covers the coupler 250. The metal caps 260 and 270 are coupled to two opposite ends of the cooling shelf 284. In some implementations, the metal caps 260 and 270 are also in conductive thermal contact with the cooling shelf 284.

Similarly, in some implementations, the metal cap 262 covers the coupler 242, while the metal cap 268 covers the coupler 248. The metal caps 262 and 268 are coupled to two opposite ends of the cooling shelf 282. The metal cap 264 covers the coupler 244, while the metal cap 266 covers the coupler 246. The metal caps 264 and 266 are coupled to two opposite ends of the cooling shelf 280. Likewise, the metal caps 264, 266, 268, and 270 can be in conductive thermal contact with their respective cooling shelves 280 and 282. In some implementations, the metal caps reinforce the thermal conductivity between various components in the coolant circulation system 200.

While coolant circulation system 200 is shown as including all of the components described herein with respect to FIG. 6, more or fewer components can be included in a coolant circulation system in a server chassis. For example, a first alternative coolant circulation system may include metal tubes that are integral with one another, thereby eliminating the need for couplers. A second alternative coolant circulation system may include six quadrants instead of four. Thus, various coolant circulation systems can be formed using any portion or portions of the components shown and described herein and/or in combination with one or more other components.

Figure 7:
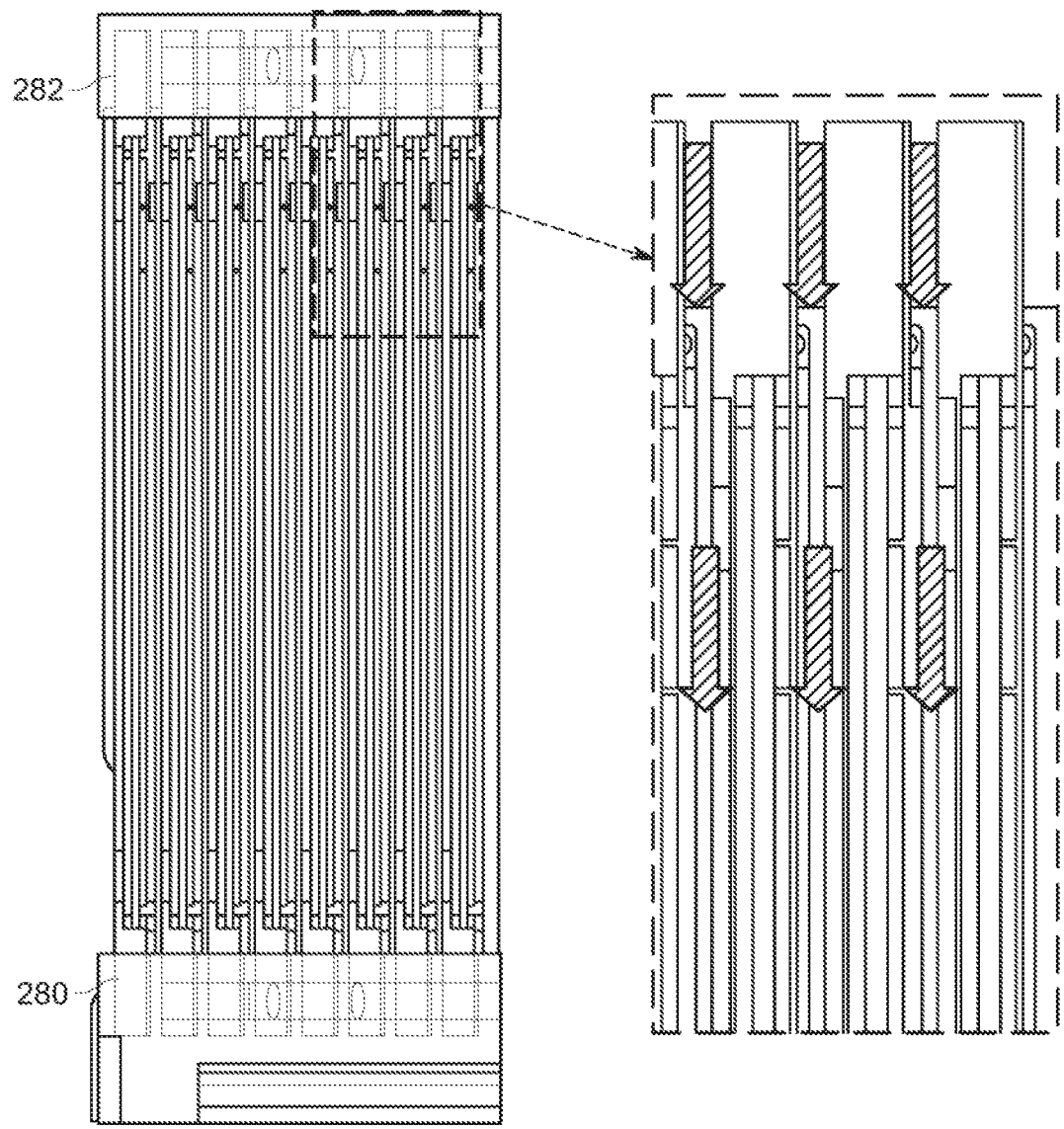
FIG. 7 depicts a top view of a coolant circulation system having cooling assemblies, according to some implementations of the present disclosure.

As shown in FIGS. 6-7, coolant only flows underneath both arm portions of the cooling assemblies. The cooling assemblies in a particular quadrant can be placed between two cooling shelves (e.g., 280 and 282), and in parallel with one another, thereby allowing air flow between adjacent cooling assemblies. As such, in some implementations, the coolant circulation system 200 is a hybrid system of air cooling and liquid cooling. The coolant circulation system 200 provides air flow paths between adjacent cooling assemblies (FIG. 7).

Simulation Data

Figure 8A:
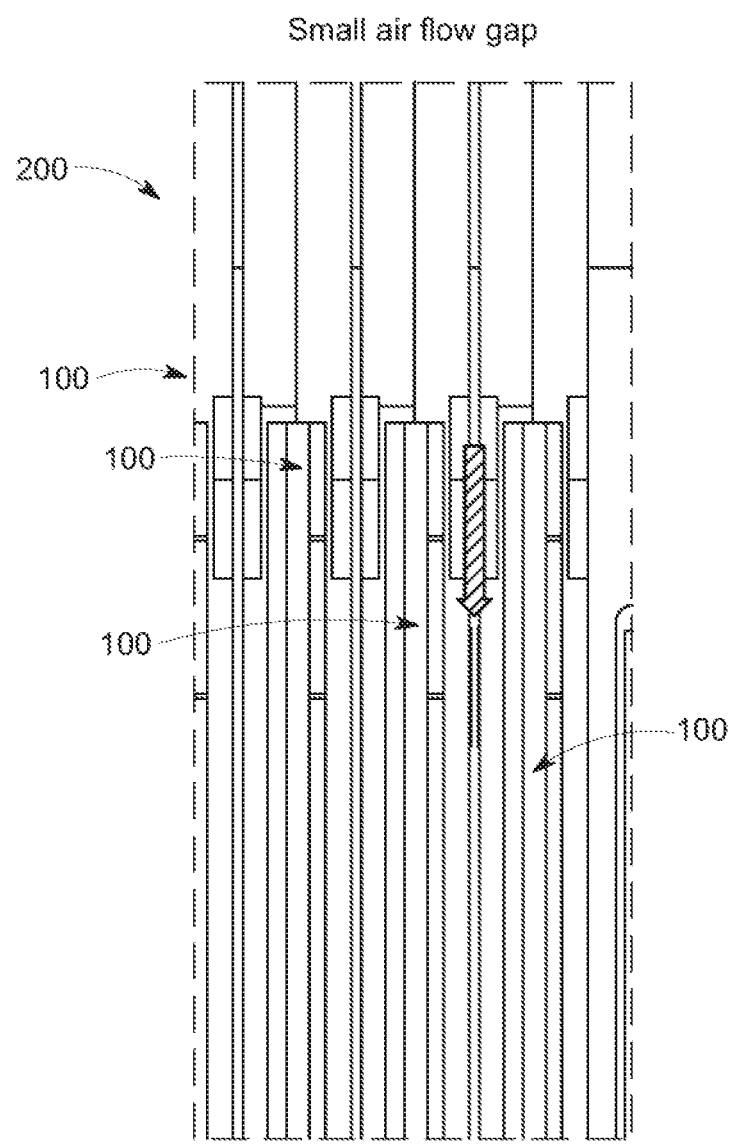
FIG. 8A depicts a top view of air flow paths between the adjacent example cooling assemblies in FIG. 7, according to some implementations of the present disclosure.
Figure 8B:
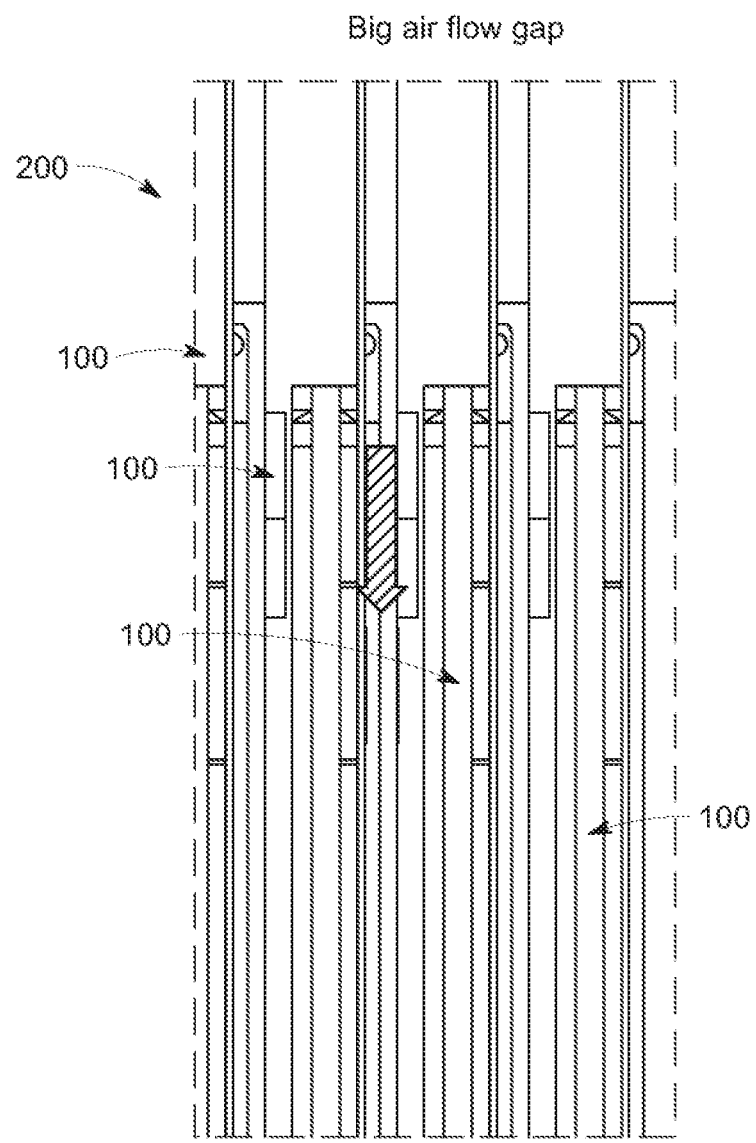
FIG. 8B depicts another top view of air flow paths between the adjacent example cooling assemblies in FIG. 7, according to some implementations of the present disclosure.

FIG. 8A depicts a top view of air flow paths between adjacent cooling assemblies 100 in the coolant circulation system 200 of the present disclosure. For the purpose of simulation, the upper left corner of the third quadrant 203 of FIG. 6 is used; and cooling fans are placed to the left of the coolant circulation system 200. Each cooling assembly 100 of FIG. 8A includes a primary plate, a secondary plate, a cooling plate, and two padding layers on either side of a memory card. The adjacent cooling assemblies in FIG. 8A are separated by 1 mm. Similarly, FIG. 8B depicts another top view of air flow paths between adjacent cooling assemblies. Each cooling assembly of FIG. 8B is the same as that of FIG. 8A, except that the adjacent cooling assemblies in FIG. 8B are separated by 2 mm.

Simulations demonstrate the effectiveness of heat redistribution for the cooling assemblies 100 in coolant circulation system 200 shown in FIGS. 8A-8B. The coolant used for "liquid cooling" was water at 40° C. initially flowing in the coolant circulation system. The water was circulated by the coolant circulation system at the rate of one liter per minute. The air used for "air cooling" was initially at 40° C., and is circulated by the coolant circulation system at the rate of 51 cubic feet per minute.

TABLE 1

Air and liquid cooling simulation results

| Air flow gap | Air cooling enabled | | Air + liquid cooling enabled | |
| --- | --- | --- | --- | --- |
| | Small | Big | Small | Big |
| Memory temperature | 64.7° C. | 62.6° C. | 55.4° C. | 55.2° C. |

As Table 1 shows, temperature of the memory cards is higher when the cooling assemblies are separated by 1 mm (FIG. 8A) than when the cooling assemblies are separated by 2 mm (FIG. 8B), regardless of whether only air cooling is enabled, or both air cooling and liquid cooling are enabled.

Figure 9A:
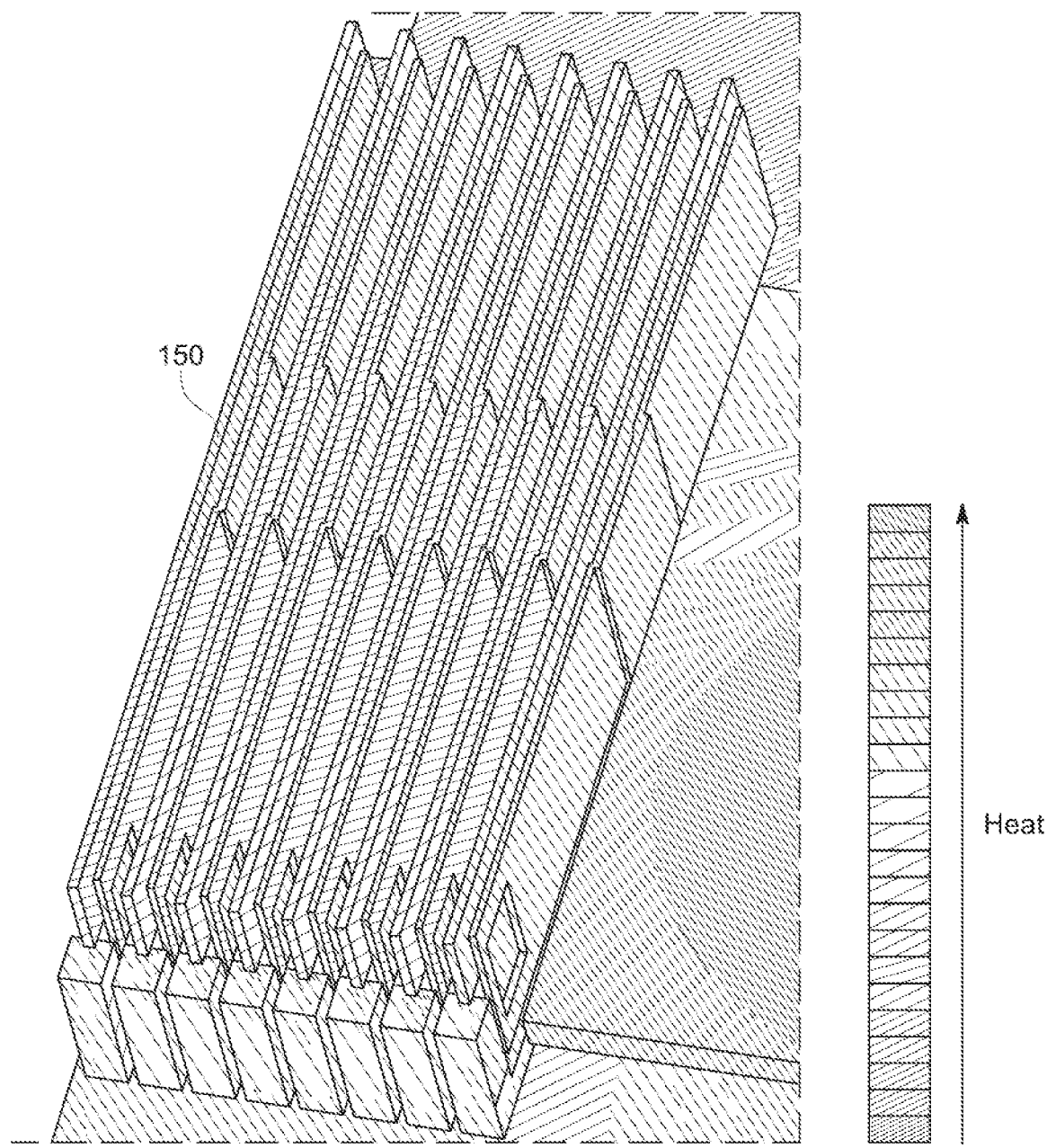
FIG. 9A depicts a temperature distribution of example cooling assemblies with air cooling enabled, according to some implementations of the present disclosure.
Figure 9B:
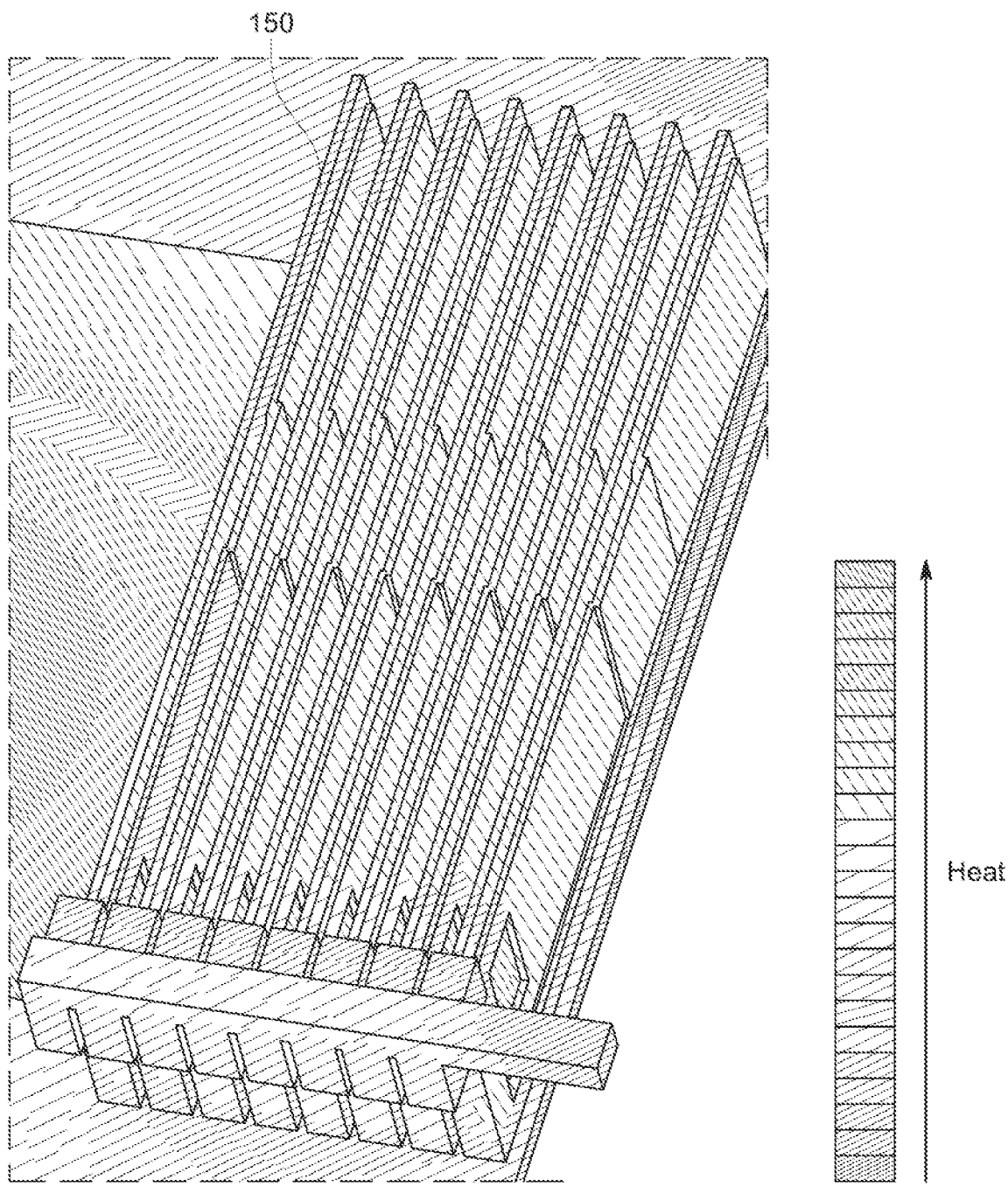
FIG. 9B depicts a temperature distribution of example cooling assemblies with liquid cooling enabled, according to some implementations of the present disclosure.

As a further illustration, FIG. 9A depicts the temperature distribution of cooling assemblies with only air cooling enabled. FIG. 9B depicts the temperature distribution of the cooling assemblies of FIG. 9A with both air cooling and liquid cooling enabled. The memory cards 150 have a lower temperature in FIG. 9B (liquid cooling) than in FIG. 9A (air cooling). Further, Table 1 also shows that regardless of the width of the air flow paths between adjacent cooling assemblies, liquid cooling is more efficient than air cooling.

Moreover, increasing (e.g., doubling) the width of the air flow paths between adjacent cooling assemblies only provides a slight decrease in temperature of the memory cards. (See Table 1.) Therefore, the coolant circulation system of the present disclosure can receive more cooling assemblies with a smaller distance between adjacent cooling assemblies, while still effectively providing cooling to the heat-generating electrical components in the cooling assemblies.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A cooling assembly comprising:
   a primary plate having a body, a first arm, and a second arm, the first arm and the second arm of the primary plate extending outwardly in opposite directions from the body of the primary plate;

a secondary plate having a body, a first arm, and a second arm, the first arm and the second arm of the secondary plate extending outwardly in opposite directions from the body of the secondary plate; and a first padding layer between the primary plate and the secondary plate, the first padding layer directly contacting a heat-generating electrical component secured between the primary plate and the secondary plate.

2. The cooling assembly of claim 1, wherein the primary plate further includes a protrusion extending perpendicularly from the primary plate, the protrusion configured to engage a corresponding aperture of the secondary plate to secure the heat-generating electrical component between the primary plate and the secondary plate.

3. The cooling assembly of claim 2, wherein the protrusion of the primary plate extends through a notch of the heat-generating electrical component to secure the heat-generating electrical component between the primary plate and the secondary plate.

4. The cooling assembly of claim 1, wherein the heat-generating electrical component is a memory card.

5. The cooling assembly of claim 4, wherein the memory card is a Synchronous Dynamic Random-Access Memory (SDRAM).

6. The cooling assembly of claim 5, wherein the SDRAM is a Double Data Rate 5 (DDR5) SDRAM.

7. The cooling assembly of claim 1, further comprising a heat pipe in contact with a depression of the primary plate, wherein the depression corresponds to a shape of the heat pipe.

8. The cooling assembly of claim 7, wherein the heat pipe is configured to snap-fit to the depression of the primary plate.

9. The cooling assembly of claim 7, wherein the heat pipe is U-shaped and extends across a width of the body of the primary plate.

10. The cooling assembly of claim 1, further comprising a second padding layer between the primary plate and the secondary plate, the first padding layer and the second padding layer directly contacting opposite sides of the heat-generating electrical component.

11. A coolant circulation system comprising:
an inlet for delivering coolant at a first temperature;
an outlet for receiving coolant at a second temperature, the second temperature being greater than the first temperature;
a fluidic circuit between the inlet and the outlet, the fluidic circuit including a first tube and a second tube, the first tube being coupled to the inlet, the second tube coupled to the first tube and the outlet;
a first cooling shelf in conductive thermal contact with the first tube; and
a second cooling shelf in conductive thermal contact with the second tube, wherein the first cooling shelf and the second cooling shelf support a first cooling assembly including, a contact plate, a first arm portion, and a second arm portion, wherein the first arm portion of the first cooling assembly is in conductive thermal contact with the first cooling shelf, and the second arm portion of the first cooling assembly is in conductive thermal contact with the second cooling shelf.

12. The coolant circulation system of claim 11, wherein the contact plate of the first cooling assembly being configured to house a heat-generating electrical component, such that the first cooling assembly is in conductive thermal contact with the heat-generating electrical component.

13. The coolant circulation system of claim 12, wherein the heat-generating electrical component is a memory card.

14. The coolant circulation system of claim 11, wherein the first arm portion of the first cooling assembly extends from a first end of the contact plate of the first cooling assembly, and wherein the second arm portion of the first cooling assembly extends from a second end of the contact plate of the first cooling assembly.

15. The coolant circulation system of claim 11, wherein the first tube is integral to the second tube.

16. The coolant circulation system of claim 11, wherein the first cooling shelf and the second cooling shelf further support a second cooling assembly, such that an air flow path exists between the first cooling assembly and the second cooling assembly.

17. The coolant circulation system of claim 16, wherein the first cooling shelf and the second cooling shelf support the first cooling assembly and the second cooling assembly in parallel.

18. The coolant circulation system of claim 11,
wherein the first cooling assembly includes a primary plate and a secondary plate, the primary plate including a body, a first arm, and a second arm, the secondary plate including a body, a first arm, and a second arm;
wherein the contact plate of the first cooling assembly includes the body of the primary plate, and the body of the secondary plate;
wherein the first arm portion of the first cooling assembly includes the first arm of the primary plate, and the first arm of the secondary plate; and
wherein the second arm portion of the first cooling assembly includes the second arm of the primary plate, and the second arm of the secondary plate.

19. The coolant circulation system of claim 11, further comprising a cooling fan positioned at an end of the coolant circulation system.

* * * * *